(12) United States Patent
Bedarida et al.

(10) Patent No.: US 9,621,112 B2
(45) Date of Patent: *Apr. 11, 2017

(54) SENSE AMPLIFIER

(71) Applicant: Atmel Corporation, San Jose, CA (US)

(72) Inventors: Lorenzo Bedarida, Vimercate (IT); Emmanuel Racape, Aix-en-Provence (FR); Xiaobao Wang, Shanghai (CN); Sheng Huang, Shanghai (CN)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/262,805

(22) Filed: Sep. 12, 2016

(65) Prior Publication Data

US 2016/0380596 A1 Dec. 29, 2016

Related U.S. Application Data

(63) Continuation of application No. 14/236,252, filed as application No. PCT/CN2013/001186 on Sep. 30, 2013, now Pat. No. 9,444,408.

(51) Int. Cl.
*G11C 11/34* (2006.01)
*H03F 1/02* (2006.01)
*G11C 7/08* (2006.01)
*H03F 3/16* (2006.01)

(52) U.S. Cl.
CPC ............ *H03F 1/0233* (2013.01); *G11C 7/08* (2013.01); *H03F 3/16* (2013.01); *H03F 2200/462* (2013.01); *H03F 2200/66* (2013.01)

(58) Field of Classification Search
CPC .... H03F 1/0233; H03F 3/16; H03F 2200/462; H03F 2200/66; G11C 7/08

USPC .......... 365/185.21, 185.22, 189.011, 189.15, 365/196, 207

See application file for complete search history.

(56) References Cited

U.S. PATENT DOCUMENTS

| 7,167,051 B2 | 1/2007 | Botker |
| 8,169,845 B2 | 5/2012 | Fort |
| 9,444,408 B2 | 9/2016 | Bedarida et al. |
| 2009/0073781 A1 | 3/2009 | Fort |

FOREIGN PATENT DOCUMENTS

| CN | 1802707 | 7/2006 |
| CN | 102148051 | 8/2011 |

OTHER PUBLICATIONS

International Search Report and Written Opinion in International Application No. PCT/CN2013/001186, dated Jul. 4, 2014, 14 pages.

*Primary Examiner* — Fernando Hidalgo
(74) *Attorney, Agent, or Firm* — Fish & Richardson P.C.

(57) ABSTRACT

A sense amplifier measures a state of a memory cell coupled to a sense node. The sense amplifier receives a control signal to enable the sense amplifier. The sense amplifier generates a voltage based on an amplifier current that is based on a sense current flowing through the sense node. The sense amplifier generates a feedback current based on the voltage to compensate variations of the sense current. The sense amplifier receives a reference control signal to enable a reference circuit to generate a reference current. The sense amplifier provides an output based on a result of comparing the sense current with the reference current, the output representing the state of the memory cell.

20 Claims, 4 Drawing Sheets

US 9,621,112 B2

SENSE AMPLIFIER

CLAIM OF PRIORITY

This application is a continuation and claims priority to U.S. patent application Ser. No. 14/236,252 filed Jan. 30, 2014, which is a U.S. National Application of PCT/CN2013/001186 filed Sep. 30, 2013, the entire contents of which are hereby incorporated by reference.

TECHNICAL FIELD

This disclosure relates generally to electrical circuits and more particularly to sense amplifiers for semiconductor memories.

BACKGROUND

Semiconductor memories can be considered as the most vital components of digital logic system design for computers, microcontrollers, Digital Signal Processors (DSPs) and other microprocessor-based applications. With an increasing tendency to embedded memories, limitations of memory periphery circuitry could seriously affect an overall system performance of the semiconductor memories in terms of precision, speed and power dissipation.

A sense amplifier can be one of most critical circuits in the periphery of a semiconductor memory. The sense amplifier can retrieve stored data in memory cells by amplifying small signal variations in bitlines. Due to CMOS technology tending towards deep submicron area, bitlines tend to exhibit significant capacitance, and transistors provide a low small signal voltage gain. As a result, designing a fast, high precision and low power sense amplifier can become challenging.

SUMMARY

A sense amplifier measures a state of a memory cell coupled to a sense node. The sense amplifier receives a control signal to enable the sense amplifier. The sense amplifier generates a voltage based on an amplifier current that is based on a sense current flowing through the sense node. The sense amplifier generates a feedback current based on the voltage to compensate variations of the sense current. The sense amplifier receives a reference control signal to enable a reference circuit to generate a reference current. The sense amplifier provides an output based on a result of comparing the sense current with the reference current, the output representing the state of the memory cell.

Particular implementations of the sense amplifier can provide one or more of the following advantages: 1) the sense amplifier simplifies bias circuit and polarization path, and reduces the number of components, allowing lower cost, smaller chip area and lower power consumption; 2) the sense amplifier adopts current mirror arrangements to track and compensate variations of the sense current, improving measurement precision on the state of the memory cell; 3) the sense amplifier makes bias voltage different from supply voltage, allowing lower bias voltage and lower power consumption; 4) the sense amplifier makes the reference circuit only enabled during a detection phase and disabled during a sense phase, allowing lower power consumption; and 5) the sense amplifier can shorten a read operation, increasing read speed.

The details of one or more disclosed implementations are set forth in the accompanying drawings and the description below. Other features, aspects, and advantages will become apparent from the description, the drawings and the claims.

DETAILED DESCRIPTION

System Overview

Figure 1:
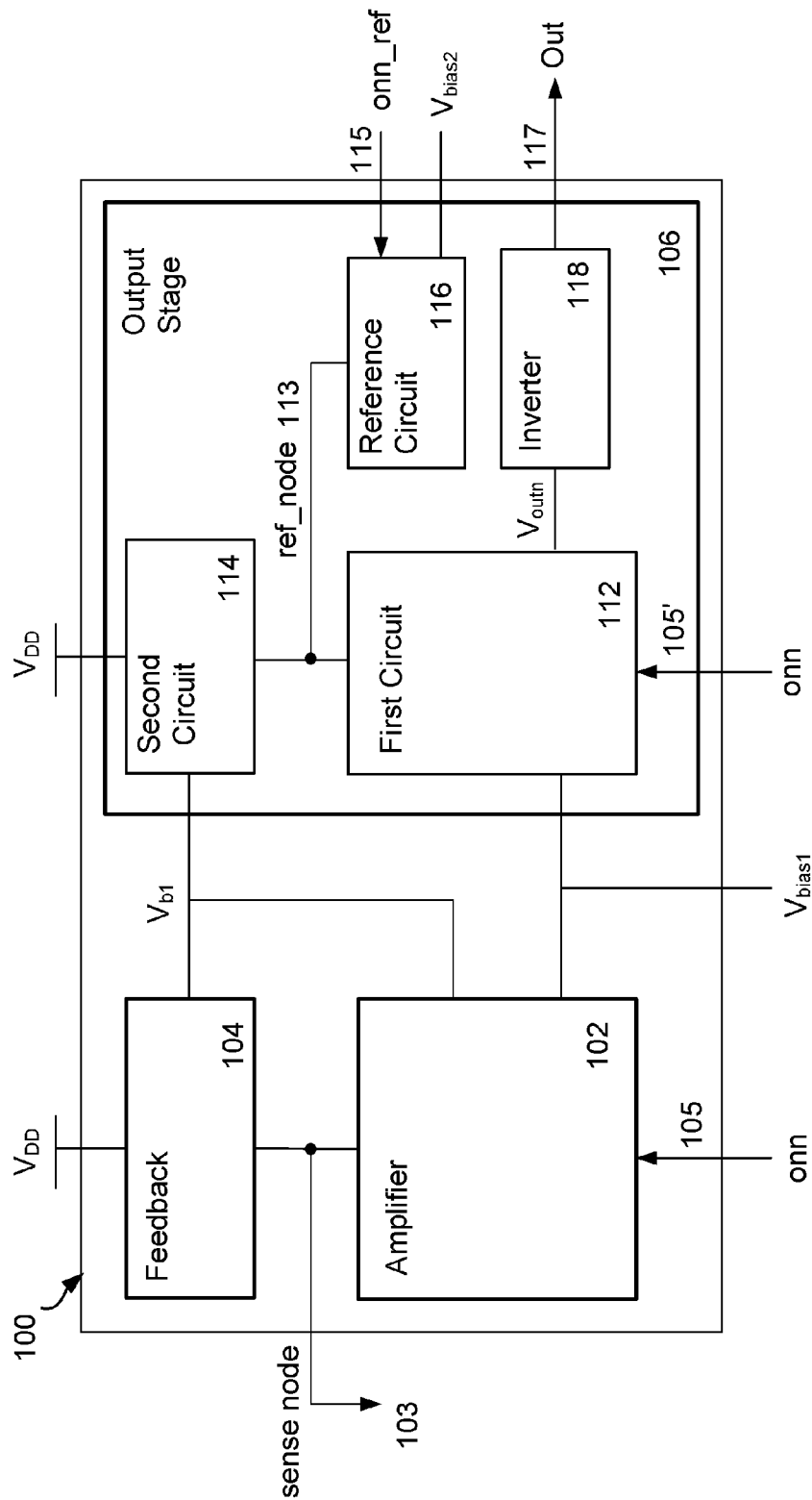
FIG. 1 is a block diagram of an example device.

FIG. 1 is a block diagram of an example device (e.g., a sense amplifier) 100. The device 100 includes an amplifier (e.g., a transimpedance amplifier) 102, a feedback circuit 104, and an output stage 106. The feedback circuit 104 is coupled to the amplifier 102, and a sense node (e.g., bitline node) 103 is coupled between the amplifier 102 and the feedback circuit 104.

In some implementations, the amplifier 102 receives a control signal 105 (e.g., onn signal). The control signal 105 can enable and disable the amplifier 102 (thus the device 100). In some examples, as explained further below with reference to FIG. 3, the control signal 105 has an off phase, a sense phase, and a decision phase starting at the end of the sense phase. The control signal 105 is configured to disable the device 100 during the off phase and enable the device 100 during the sense phase and the decision phase.

In some implementations, the amplifier 102 generates a voltage (e.g., $V_{b1}$) based on an amplifier current (e.g., $I_{amp}$) flowing through the amplifier 102. When the amplifier 102 is enabled by the control signal 105, the feedback circuit 104 can receive the voltage and generate a feedback current (e.g., $I_{feed}$) based on the received voltage. In some examples, the feedback circuit 104 receives a supply voltage (e.g., $V_{DD}$).

In some implementations, the feedback current $I_{feed}$ flowing through the feedback circuit 104 flows to the amplifier 102 and the sense node 103, thus the feedback current $I_{feed}$ is a sum of the amplifier current $I_{amp}$ flowing through the amplifier 102 and a sense current $I_{sense}$ flowing through the sense node 103, e.g., $I_{feed}=I_{amp}+I_{sense}$.

In some implementations, the amplifier 102 receives a bias voltage (e.g., $V_{bias1}$). The bias voltage can be different from the supply voltage and has less dependence (or no dependence) with the supply voltage, thus lower power consumption can be achieved. When the bias voltage $V_{bias1}$ is higher than a threshold voltage of the amplifier 102, the amplifier 102 can precharge the sense node 103 to a stable value. In some examples, the stable value can be up to the supply voltage $V_{DD}$ of the feedback circuit 104, when no sense current flows through the sense node 103.

When the amplifier 102 is enabled, the voltage $V_{b1}$ rises from ground and stabilizes during the sense phase. The precharged voltage at the sense node 103 may vary and then stabilize to a final value. The final value can be defined by an impedance of the sense node 103 and a sum of the sense current and the amplifier current (that is the feedback current). Variations of the sense current can be tracked, and the feedback circuit 104 can compensate the variations of the sense current, together with the amplifier 102.

In some implementations, the output stage 106 is configured to compare the sense current with a current threshold $I_{thr}$ and output a result of the comparison. The output stage 106 can include a first circuit 112, a second circuit 114, and a reference circuit 116.

In some implementations, the first circuit 112 is configured to be in a first current mirror arrangement with the amplifier 102, so that a first current (e.g., $I_1$) flowing through the first circuit 112 corresponds to the amplifier current $I_{amp}$. In some examples, the first current is the amplifier current multiplied by a first factor (e.g., $I_1 = m \times I_{amp}$, where m is the first factor). The first circuit 112 can connect to the amplifier 102 and receive the same bias voltage $V_{bias1}$ as the amplifier 102. The first circuit 112 can also receive a control signal 105' (e.g., onn signal) for enabling and disabling the first circuit 112. In some examples, the control signal 105' for the first circuit 112 is the control signal 105 for the amplifier 102.

In some implementations, the second circuit 114 is configured to be in a second current mirror arrangement with the feedback circuit 104, so that a second current (e.g., $I_2$) flowing through the second circuit corresponds to the feedback current $I_{feed}$. In some examples, the second current is the feedback current multiplied by a second factor (e.g., $I_2 = n \times I_{feed}$, where n is the second factor). The second circuit 114 can connect to the feedback circuit 104 and receive the same voltage $V_{b1}$ as the feedback circuit 104. The second circuit 114 can also receive a supply voltage (e.g., $V_{DD}$), same as the feedback circuit 104.

In some implementations, the reference circuit 116 is configured to receive a reference control signal 115 (e.g., onn_ref signal) for enabling and disabling the reference circuit 116, and to generate a reference current (e.g., $I_{ref}$) when the reference circuit 116 is enabled. In some examples, the reference current $I_{ref}$ defines the current threshold $I_{thr}$. The reference current can be the current threshold $I_{thr}$ multiplied by a third factor (e.g., $I_{ref} = p \times I_{thr}$, where p is the third factor). The reference circuit 116 can also receive a reference bias voltage (e.g., $V_{bias2}$). Similar to the bias voltage for the amplifier 102, the reference bias voltage can be different from the supply voltage and has less dependence (or no dependence) with the supply voltage. In some examples, the reference bias voltage is lower than the supply voltage, and less power consumption can be achieved. In some examples, the reference bias voltage is provided by an external voltage supply, and higher stability can be achieved.

In some examples, as explained further below with reference to FIG. 3, the reference control signal 115 has an off phase, a sense phase, and a decision phase starting at the end of the sense phase. Each of the phases of the reference control signal 115 is the same as the corresponding phase of the control signal 105. The reference control signal 115 is configured to disable the reference circuit 116 during the off phase and the sense phase and enable the reference circuit 116 during the decision phase. Therefore, during the decision phase, both the device 100 and the reference circuit 116 are enabled; during the sense phase, the device 100 is enabled but the reference circuit 116 is disabled, so that average power consumption can be decreased.

In some implementations, the reference circuit 116 is coupled between the first circuit 112 and the second circuit 114 at a reference node 113 (e.g., ref_node). During the detection phase, the second current $I_2$ flowing through the second circuit 114 flows to the first circuit 112 and the reference circuit 116, thus the second current $I_2$ is a sum of the first current $I_1$ flowing through the first circuit 112 and the reference current $I_{ref}$ flowing through the reference circuit 116, e.g., $I_2 = I_1 + I_{ref}$.

In some examples, the first factor m is the second factor n. The third factor p can be configured to be the second factor n (thus the first factor m). Thus, the second current $I_2$ can be expressed as:

$$I_2 = n \times I_{feed} = I_1 + I_{ref} = m \times I_{amp} + p \times I_{thr}. \quad (I)$$

When p=n=m, Equation (I) can be derived to:

$$I_{feed} = I_{amp} + I_{thr}. \quad (II)$$

Since $I_{feed} = I_{amp} + I_{sense}$, the output stage 106 can be used to compare the sense current $I_{sense}$ with the current threshold $I_{thr}$.

In some implementations, the first circuit 112 generates an output voltage (e.g., $V_{outn}$). The output voltage is based on a result of comparing the sense current with the current threshold. During the decision phase, if the sense current is larger than the current threshold (e.g., $I_{sense} > I_{thr}$), the output voltage $V_{outn}$ will be increased to be a higher voltage level $V_{high}$ until clamped. If the sense current is smaller than the current threshold (e.g., $I_{sense} < I_{thr}$), the output voltage $V_{outn}$ will be decreased to a lower voltage level $V_{low}$ until clamped.

In some implementations, the output stage 106 includes an inverter 118 coupled to the first circuit 112. The inverter 118 receives the output voltage $V_{outn}$ and provides an output 117 based on the output voltage. The inverter 118 can generate a voltage based on a comparison between the output voltage and an inverter threshold voltage ($Vth_{INV}$).

In some examples, the inverter 118 is configured to change the output voltage with the same polarity. In other examples, the inverter 118 is configured to change the output voltage with an opposite polarity. For example, if $V_{outn} > Vth_{INV}$, the inverter 118 can generate a voltage close to 0 V; if $V_{outn} < Vth_{INV}$, the inverter 118 can generate a voltage close to a high voltage (e.g., $V_{DD}$).

In some examples, the inverter threshold voltage $Vth_{INV}$ can be designed to be larger than the lower voltage level $V_{low}$ but smaller than the higher voltage level $V_{high}$. Thus, when the sense current is larger than the current threshold, the output voltage can be a higher voltage level $V_{high}$ and the output 217 of the inverter 218 can be a low voltage (e.g., 0 V). When the sense current is smaller than the current threshold, the output voltage can be a lower voltage level $V_{low}$ and the output 217 of the inverter 218 can be a high voltage (e.g., $V_{DD}$).

Example Sense Amplifier

Figure 2:
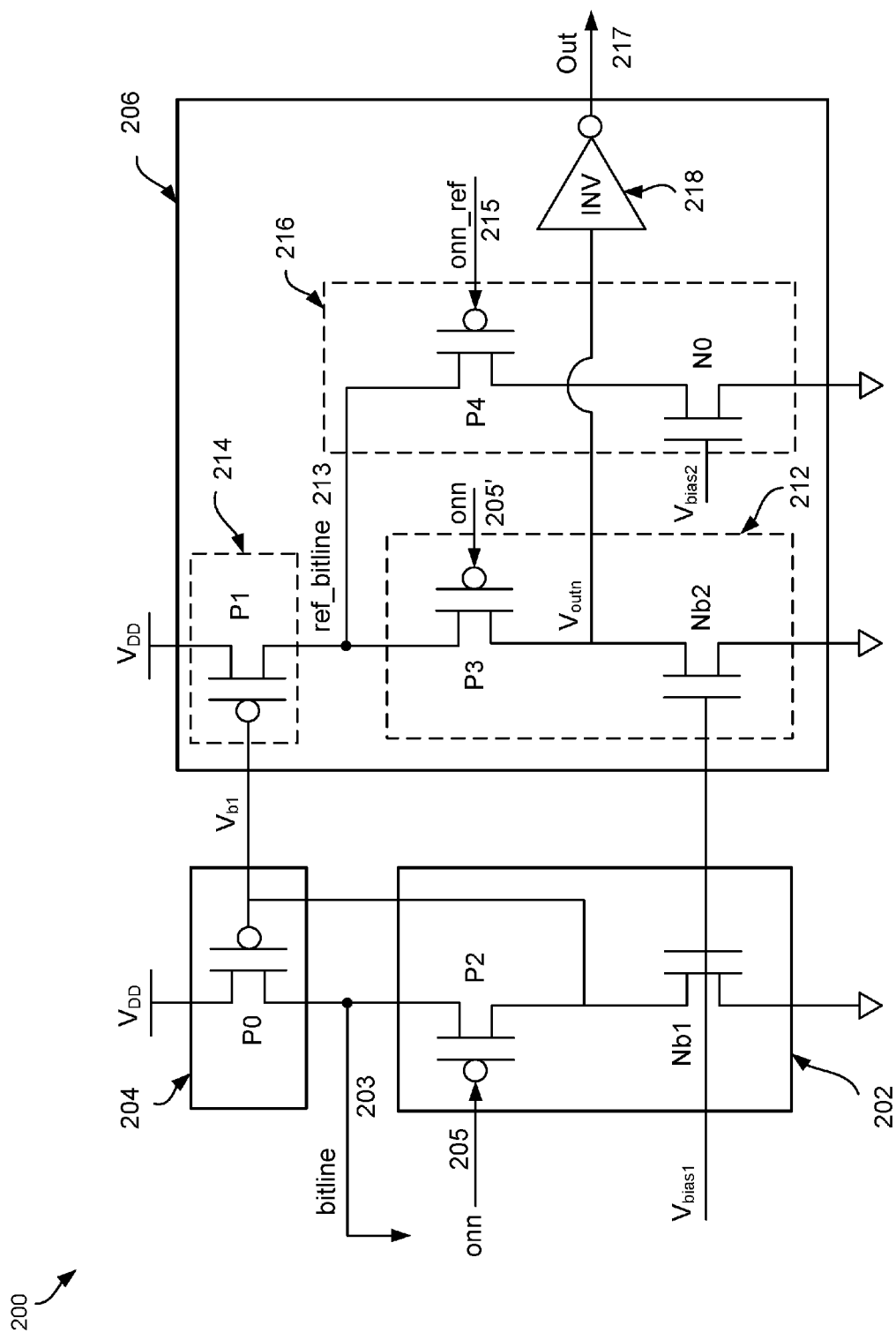
FIG. 2 is a diagram of an example sense amplifier.

FIG. 2 is a diagram of an example sense amplifier 200 that can precharge a bitline node, compensate variations of a memory cell current of a selected memory cell flowing through the bitline node, and provide an output representing a state of the selected memory cell.

The sense amplifier 200 includes a transimpedance amplifier 202 (e.g., the amplifier 102 of FIG. 1), a feedback circuit 204 (e.g., the feedback circuit 104 of FIG. 1), and an output stage 206 (e.g., the output stage 106 of FIG. 1). The feedback circuit 204 is coupled to the transimpedance amplifier 202, and a bitline node 203 (e.g., the sense node 103 of FIG. 1) is coupled between the transimpedance amplifier 202 and the feedback circuit 204.

In some implementations, the bitline node 203 is coupled to a selected memory cell in a semiconductor memory. A selected memory cell current (e.g., $I_{cell}$) of the selected memory cell represents a state of the selected memory cell (e.g., a stored bit 0 or 1). The selected memory cell current flows through the bitline node 203 and is equal to a bitline current (e.g., $I_{bitline}$) at the bitline node 203.

In a read operation, the sense amplifier 200 can precharge the bitline node 203 to a voltage level and monitor the bitline current at the bitline node 203 (thus the selected memory cell current). Memory cell current generated by a memory cell may vary due to temperature, supply voltage, and manufacturing processes used in constructing the components. The sense amplifier 200 can track variations of the bitline current and compensate the variations to maintain measurement precision on the bitline current (thus the selected memory cell current).

The sense amplifier 200 can compare the bitline current $I_{bitline}$ with a current threshold (e.g., $I_{thr}$) and output a result of the comparison to represent the state of the selected memory cell. If the bitline current (thus the selected memory cell current) is larger than the current threshold (e.g., $I_{bitline} > I_{thr}$), then the stored bit of the selected memory cell can be, for example, a logic 0. If the bitline current is smaller than the current threshold (e.g., $I_{bitline} < I_{thr}$), then the stored bit of the selected memory cell can be, for example, a logic 1.

In some implementations, the feedback circuit 204 includes a p-type transistor P0, e.g., p-channel metal-oxide-semiconductor field-effect transistors (PMOS). The transistor P0 includes a source receiving a high supply voltage (e.g., $V_{DD}$) from a voltage supply (e.g., an external power supply), a drain connecting to the transimpedance amplifier 202 and the bitline node 203, and a gate receiving a voltage (e.g., $V_{b1}$) from the transimpedance amplifier 202.

In some implementations, the transimpedance amplifier 202 includes a p-type transistor $P_2$ (e.g., PMOS), and an n-type transistor $Nb_1$, e.g., n-channel metal-oxide-semiconductor field-effect transistors (NMOS). The p-type transistor P2 includes a source coupled to the drain of the transistor P0, a drain coupled to a drain of the transistor Nb1, and a gate receiving a control signal 205 (e.g., the control signal 105 of FIG. 1). The control signal 205 (e.g., onn signal) can enable and disable the transistor P2 (thus the sense amplifier 200). The n-type transistor Nb1 includes a drain coupled to the drain of the transistor P2, a source coupled to a ground, and a gate receiving a bias voltage (e.g., $V_{bias1}$) from an external bias voltage supply. The bias voltage for the transistor Nb1 can be different from the supply voltage for the transistor P0, thus lower power consumption can be achieved. In some examples, the bias voltage has no dependence with the supply voltage.

In some implementations, the output stage 206 is configured to compare the bitline current $I_{bitline}$ with a current threshold $I_{thr}$ and output a result of the comparison to represent the state of the selected memory cell. The output stage 206 can include a first circuit 212, a second circuit 214, a reference circuit 216 and an inverter 218.

In some implementations, the second circuit 214 includes a p-type transistor P1 (e.g., PMOS). The transistor P1 is configured to be in a current mirror arrangement with the transistor P0, so that a current flowing through the transistor P1 (e.g., $I_{P1}$) corresponds to the feedback current Ikea flowing through the transistor P0. In some examples, the second current is the feedback current multiplied by a factor n, e.g., $I_{P1} = n \times I_{feed}$. The transistor P1 includes a source receiving a supply voltage (e.g., $V_{DD}$), a gate coupled to the gate of the transistor P0 for receiving the same voltage $V_{b1}$, and a drain coupled to the first circuit 212 and the reference current 216 via a reference bitline node 213 (e.g., ref_node 113 of FIG. 1).

In some implementations, the first circuit 212 includes a p-type transistor P3 (e.g., PMOS) and an n-type transistor Nb2 (e.g., NMOS). The transistor P3 is configured to be in a current mirror arrangement with the transistor P2, so that a current flowing through the transistor P3 (e.g., $I_{P3}$) corresponds to the current flowing through the transistor P2 (e.g., $I_{P2}$). In some examples, $I_{P3}$ is $I_{P2}$ multiplied by a factor m, e.g., $I_{P3} = m \times I_{P2}$. The transistor P3 includes a source coupled to the drain of the transistor P1, a drain coupled to a drain of the transistor Nb2, and a gate receiving a control signal 205' (e.g., the control signal 105' of FIG. 1). The control signal 205' can enable and disenable the transistor P3 (thus the sense amplifier 200).

The n-type transistor Nb2 is configured to be in a current mirror arrangement with the n-type transistor Nb1, so that a current flowing through the transistor Nb2 (e.g., $I_{Nb2}$) corresponds to a current flowing through the transistor Nb1 (e.g., $I_{Nb1}$). In some examples, $I_{Nb2}$ is $I_{Nb1}$ multiplied by a factor q, e.g., $I_{Nb2} = q \times I_{Nb1}$. The transistor Nb2 includes a drain coupled to the drain of the transistor P3, a source coupled to a ground and a gate coupled to the gate of the transistor Nb1 for receiving the same bias voltage $V_{bias1}$. The first circuit 212 generates an output voltage (e.g., $V_{outn}$) at a point between the drain of the transistor P3 and the drain of transistor Nb2, and provides the output voltage $V_{outn}$ to the inverter 218.

In some implementations, the reference circuit 216 is a reference current source that is configured to receive a reference control signal 215 (e.g., the reference control signal 115 of FIG. 1) for enabling and disabling the reference circuit 216, and generate a reference current (e.g., $I_{ref}$) when the reference circuit 216 is enabled. The reference current $I_{ref}$ can define the current threshold $I_{thr}$. In some examples, the reference current is the current threshold $I_{thr}$ multiplied by a factor p, e.g., $I_{ref} = p \times I_{thr}$.

In some implementations, the reference circuit 216 includes a p-type transistor P4 (e.g., PMOS) and an n-type transistor N0 (e.g., NMOS). The transistor P4 includes a source coupled to the reference bitline node 213 between the drain of the transistor P1 and the source of the transistor P3, a drain coupled to a drain of the transistor N0, and a gate receiving the reference control signal 215. The transistor N0 includes a drain coupled to the drain of the transistor P4, a source coupled to a ground and a gate receiving a reference bias voltage (e.g., $V_{bias2}$). Similar to the bias voltage for the transistors Nb1 and Nb2, the reference bias voltage can be different from the supply voltage for the transistor P1. In some examples, the reference bias voltage is lower than the supply voltage, and lower power consumption can be achieved. The reference bias voltage can have less dependence (or no dependence) with the supply voltage. In some examples, $V_{bias2}$ is equal to $V_{bias1}$. In some other examples, $V_{bias2}$ is different from $V_{bias1}$ and has no dependence on $V_{bias1}$.

In some examples, the sense amplifier 200 is configured to have the factors n, m, q, p being equal to each other, e.g., n=m=q=p. Thus the transistors P1 and P0, P3 and P2, Nb2 and Nb1, can achieve well matching performance. The sense amplifier 200 can also improve measurement precision on the bitline current and the state of the selected memory cell.

In some implementations, the inverter 218 (e.g., the inverter 118 of FIG. 1) is coupled between the transistor P3 and the transistor Nb2, and configured to receive the output voltage $V_{outn}$ and generate an output 217 based on the output voltage $V_{outn}$. The inverter 218 can generate a voltage based on a comparison between the output voltage and an inverter threshold voltage (e.g., $Vth_{INV}$).

In some examples, the inverter 218, together with a second inverter, is configured to change the output voltage with the same polarity. In other examples, the inverter 218 is configured to change the output voltage with an opposite polarity. For example, if $V_{outn} > Vth_{INV}$, the inverter 218 can generate a voltage close to a low voltage (e.g., 0 V), corresponding to a logic zero; if $V_{outn} < Vth_{INV}$, the inverter 218 can generate a voltage close to a high voltage (e.g., $V_{DD}$), corresponding to a logic one.

Example Timing Diagram

Figure 3:
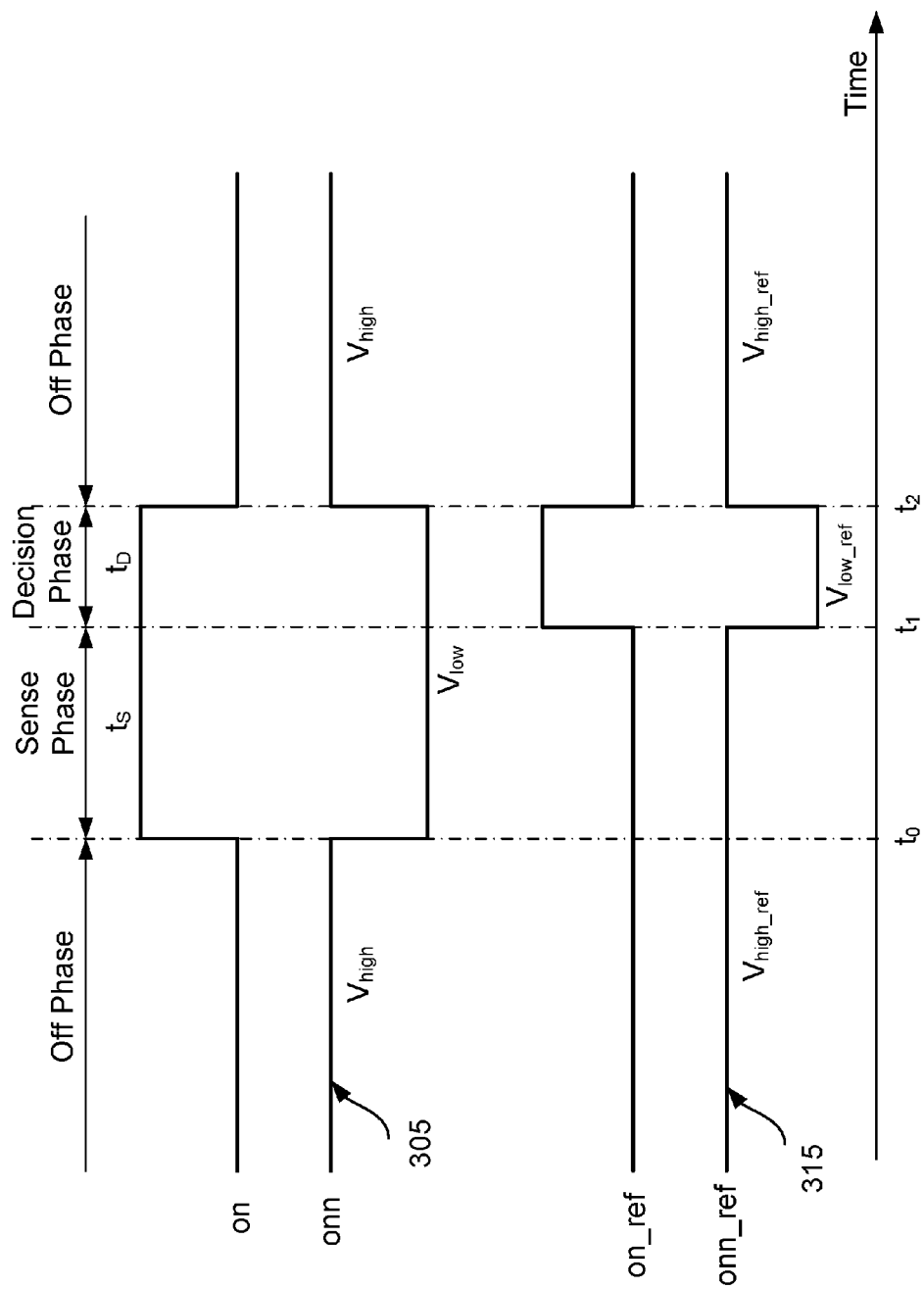
FIG. 3 is an example timing diagram of a sense amplifier.

FIG. 3 is an example timing diagram illustrating a control signal 305 and a reference control signal 315. The control signal 305 can be the control signals 105 and 105' of FIG. 1 or the control signals 205 and 205' of FIG. 2. The reference control signal 315 can be the reference control signal 115 of FIG. 1 or the reference control signal 215 of FIG. 2.

In some implementations, the control signal 305 has an off phase, a sense phase, and a decision phase. For example, the sense phase starts at time $t_0$ and ends at $t_1$ with a duration $t_s$. The decision phase is just after the sense phase, starting at time $t_1$ and ending at time $t_2$ with a duration $t_D$. The off phase includes other durations in a cycle of the control signal 305 (e.g., before time $t_0$ and after time $t_2$).

During the off phase, the control signal 305 (e.g., onn signal) can provide a high voltage $V_{high}$ (e.g., $V_{DD}$), for example, applied at the gate of the transistor $P_2$ or/and at the gate of the transistor $P_3$, which disables the sense amplifier 200. During the sense phase and the decision phase, the control signal 305 can provide a low voltage $V_{low}$ (e.g., 0 V), for example, applied at the gate of the transistor $P_2$ or/and at the gate of the transistor $P_3$, which enables the sense amplifier 200.

In some implementations, the reference control signal 315 has an off phase, a sense and a decision phase, which are the same as corresponding phases of the control signal 305. During the off phase and the sense phase, the reference control signal (e.g., onn_ref signal) can provide a high reference voltage $V_{high\_ref}$, for example, applied at the gate of the transistor P4, which disables the reference circuit 216. During the decision phase, the reference control signal can provide a low reference voltage $V_{low\_ref}$, for example, applied at the gate of the transistor P4, which enables the reference circuit 216.

During the sense phase, the sense amplifier 200 is enabled and the reference circuit 216 is disabled. In this way, average power consumption can be decreased. The duration of the sense phase is can be designed to get a stable bitline current. Increasing the current flowing through the transistor Nb1 (e.g., $I_{Nb1}$) can reduce the duration of the sense phase. In this way, the sense amplifier can achieve a fast read speed for memory cells.

During the decision phase, both the sense amplifier 200 and the reference circuit 216 are enabled. The duration of the decision phase $t_D$ can be designed to cover a reaction time of comparison and delivery on output for the sense amplifier 200. In some examples, $t_D$ is based on the current flowing through the first circuit 212 (e.g., the transistor $P_3$ and the transistor $Nb_2$) and the parasitic capacitance on an output node of the inverter 218 and the reference bitline node 213. The reference bitline node 213 may have lower parasitic capacitance than the bitline node 203.

In some implementations, the control signal 305 has an opposite polarity compared to an input control signal (e.g., on signal) that is input from an external device (e.g., a memory controller). Similarly, the reference control signal 315 can have an opposite polarity compared to an input reference control signal (e.g., on_ref signal) that is input from the external device.

Referring back to FIG. 2, in operation, a memory controller can activate a memory cell and perform a read operation on the selected memory cell by using the sense amplifier 200.

Before the sense phase (e.g., before time t0), the sense amplifier 200 can precharge the bitline to a stable value. When the bias voltage $V_{bias1}$ is higher than a threshold voltage ($Vth_{Nb1}$) of the transistor Nb1, the transistor Nb1 starts to work, generating the voltage $V_{b1}$ to 0 V to the gate of the transistor P0. As $V_{b1} < V_{DD}$, the transistor P0 is enabled. And as the transistor P2 is disabled by the control signal 205 before the sense phase (i.e., during the off phase), the bitline node 203 can be charged to a stable value. In some examples, the stable value can be up to the supply voltage $V_{DD}$ of the feedback circuit 204, if no bitline current flows through the bitline node 203.

During the sense phase, the control signals 205 and 205' enable the transistors P2 and the transistor P3, respectively. The feedback current from the transistor P0 flows to both the bitline node 203 and the transimpedance amplifier 202 (e.g., the transistors P2 and Nb1). Thus the feedback current $I_{feed}$ is a sum of the current $I_{P2}$ flowing through the transistor P2 and the bitline current $I_{bitline}$ at the bitline node 203, e.g., $I_{feed} = I_{P2} + I_{bitline}$. The current $I_{P2}$ flowing through the transistor $P_2$ is equal to the current $I_{Nb1}$ flowing through the transistor Nb1, e.g., $I_{P2} = I_{Nb1}$.

The current flowing the transistor Nb1 can vary due to a change of the flow path of the feedback current, thus the generated voltage $V_{b1}$ is changed. The precharged voltage at the bitline node 203 may also vary and stabilize to a final value. The final value can be defined by an impedance of the bitline node 203 and a sum of the current $I_{P2}$ and the bitline current $I_{bitline}$ (e.g., the feedback current $I_{feed}$).

During the sense phase, the transistors P1, P3 and Nb2 are enabled to work, and the reference circuit 216 is disabled by the reference control signal 215. The current flowing through the transistor P1 flows to the transistor P3 and then the transistor Nb2, e.g., $I_{P1} = I_{P3} = I_{Nb2}$. The current of the transistor $P_1$ is based on the voltage $V_{b1}$, and the output voltage $V_{outn}$ is based on the current of the transistor Nb2, thus the output voltage $V_{outn}$ is based on the voltage $V_{b1}$ and then the bitline current $I_{bitline}$. Therefore, the sense amplifier 200 can measure the bitline current by monitoring the output voltage.

In some examples, the bitline current at the bitline node 203 may have variations due to variations of the selected memory cell current, which causes variations of the generated voltage $V_{b1}$. The variations of the generated voltage $V_{b1}$ further cause variations of the output voltage $V_{outn}$ and then the output 217. Therefore, the sense amplifier 200 can monitor the output 217 to track the variations of bitline current. The feedback current generated by the feedback circuit 204 is also changed to have variations corresponding to the variations of the voltage $V_{b1}$, thus the feedback circuit 204 can compensate the variations of the bitline current $I_{bitline}$ (thus the variations of the selected memory cell current), together with the transimpedance amplifier 202.

During the decision phase, the feedback current flowing through the feedback circuit 204 still flows to both the bitline node 204 and the transimpedance amplifier 202 (e.g., the transistors P2 and Nb1), and is satisfied with the following equation:

$$I_{feed} = I_{P2} + I_{bitline}. \tag{III}$$

However, the reference circuit 216 is enabled after the decision phase starts. The current $I_{P1}$ flowing through the second circuit 214 is changed to flow to both the first circuit 212 (e.g., the transistors P3 and Nb2) and the reference circuit 216. In some examples, the current $I_{P1}$ is a sum of the current $I_{P3}$ flowing through the transistor P3 and the reference current $I_{ref}$ flowing through the reference circuit 216, e.g., $I_{P1}=I_{P3}+I_{ref}$.

In some examples, the current $I_{P1}$ is the feedback current multiplied by a factor n, e.g., $I_{P1}=n \times I_{feed}$; the current $I_{P3}$ is equal to $I_{P2}$ multiplied by a factor m, e.g., $I_{P3}=m \times I_{P2}$; the current $I_{Nb2}$ is $I_{Nb1}$ multiplied by a factor q, e.g., $I_{Nb2}=q \times I_{Nb1}$; the reference current is equal to the current threshold $I_{thr}$ multiplied by a factor p, e.g., $I_{ref}=p \times I_{thr}$. The factors n, m, q, p are equal to each other, e.g., n=m=q=p.

The current $I_{P1}$ can be expressed as:

$$I_{P1}=n \times I_{feed}=I_{P3}+I_{ref}=m \times I_{P2}+p \times I_{thr}. \qquad (IV)$$

When p=n=m, Equation (IV) can be reduced to:

$$I_{feed}=I_{P2}+I_{thr}. \qquad (V)$$

Since $I_{feed}=I_{P2}+I_{bitline}$, the output stage 206 can be used to compare the bitline current $I_{bitline}$ with the current threshold $I_{thr}$ defined by the reference current $I_{ref}$.

If the bitline current is larger than the current threshold (e.g., $I_{bitline}>I_{thr}$), the current $I_{P3}$ flowing through the transistor P3 will be larger than the current $I_{Nb2}$ flowing through the transistor Nb2. The output voltage $V_{outn}$ will be pulled up by the unequal current to be a higher voltage level $V_{high}$ until clamped, for example, at $V_{DD}-2V_{ds\_sat}$, where $V_{DD}$ is the supply voltage provided to the transistor P1, and $V_{ds\_sat}$ is a saturated voltage between a source and a drain of the transistor P3 or the transistor P1, assuming that the saturated voltage of the transistor P3 is equal to the saturated voltage of the transistor P1.

If the bitline current is smaller than the current threshold (e.g., $I_{bitline}<I_{thr}$), the the current $I_{P3}$ flowing through the transistor P3 will be smaller than the current $I_{Nb2}$ flowing through the transistor Nb2. The output voltage $V_{outn}$ will be pulled down by the transistor Nb2 and decreased to a lower voltage level $V_{low}$ until clamped, for example, at $V_{ds\_sat}$, where $V_{ds\_sat}$ is a saturated voltage between a source and a drain of the transistor Nb2.

In some examples, the inverter threshold voltage $Vth_{INV}$ can be designed to be larger than the lower voltage level $V_{low}$ but smaller than the higher voltage level $V_{high}$. Thus, when the bitline current is larger than the current threshold, the output voltage can be a higher voltage level $V_{high}$, and the output 217 of the inverter 218 can correspond to a logic zero, indicating that the stored bit of the selected memory cell is 0. When the bitline current is smaller than the current threshold, the output voltage can be a lower voltage level $V_{low}$, and the output 217 of the inverter 218 can correspond to a logic one, indicating that the stored bit of the selected memory cell is 1.

After the decision phase (e.g., during the off phase), the sense amplifier 200 and the reference circuit 216 are both disabled and ready for next read operation on another selected memory cell.

Example Flowchart

Figure 4:
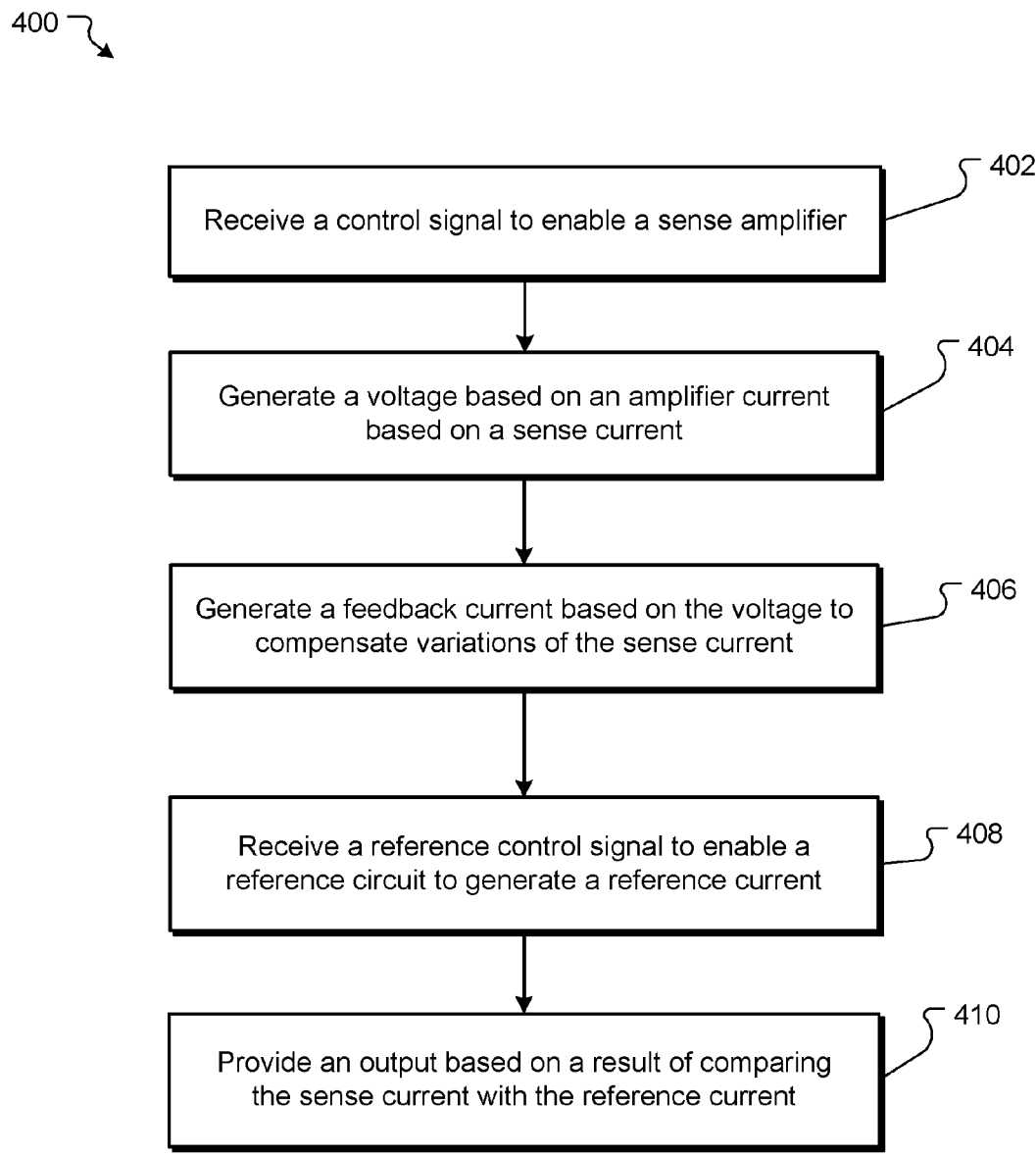
FIG. 4 is a flow diagram of an example process performed by a sense amplifier.

FIG. 4 is a flow diagram of an example process 400 performed by a sense amplifier. The sense amplifier can be the device 100 of FIG. 1 or the sense amplifier 200 of FIG. 2. In some implementations, the sense amplifier measures a state of a memory cell coupled to a sense node. A sense current at the sense node represents the state of the memory cell.

The sense amplifier receives a control signal for enabling the sense amplifier (402). The control signal has an off phase, a sense phase and a decision phase starting at the end of the sense phase. The control signal is configured to enable the sense amplifier during the sense phase and the decision phase, and disable the sense amplifier during the off phase.

The sense amplifier generates a voltage based on an amplifier current based on the sense current (404). The sense amplifier includes a transimpedance amplifier and a feedback circuit. The transimpedance amplifier is coupled to the feedback circuit, and the sense node is coupled between the transimpedance amplifier and the feedback circuit.

In some implementations, when the sense amplifier is enabled, a feedback current flowing through the feedback circuit flows to the transimpedance amplifier and the sense node, thus the feedback current is a sum of the amplifier current flowing through the transimpedance amplifier and the sense current at the sense node. The amplifier current can be based on the sense current.

The sense amplifier generates a feedback current based on the voltage to compensate variations of the sense current (406). In some examples, when the sense current has variations, the amplifier current is also changed based on the variations of the sense current, and so is the generated voltage based on the amplifier current. In some implementations, the feedback circuit includes a p-type transistor receiving the voltage on the gate. The variations of the voltage cause the variations of the feedback current. The feedback current continues flowing to the sense node and the transimpedance amplifier, thus the feedback current can compensate the variations of the sense current. In this way, the sense amplifier can maintain high measurement precision on the sense current (thus the state of the memory cell).

The sense amplifier receives a reference control signal to enable a reference circuit to generate a reference current (408). The reference control signal can be the control signal. The reference control signal can enable the reference circuit during the decision phase and disable the reference circuit during the off phase and the sense phase. The feedback circuit may include a transistor receiving a supply voltage. The reference circuit may include a transistor receiving a bias voltage. In some implementations, the bias voltage is different from the supply voltage, and the reference circuit has no dependence with the feedback circuit and the transimpedance amplifier.

The sense amplifier provides an output based on a result of comparing the sense current with the reference current (410). In some examples, the output corresponds to a logic zero or a logic one, representing the state of the memory cell (e.g., a stored bit 0 or 1).

In some implementations, the sense amplifier includes a first circuit for generating a first current corresponding to the amplifier current and a second circuit for generating a second current corresponding to the feedback current. In some examples, the first current is the amplifier current multiplied by a first factor, and the second current is the feedback current multiplied by a second factor equal to the first factor. The first circuit can generate an output voltage based on the first current and the second current (thus the sense current). Therefore, the sense amplifier can monitor and track the sense current.

In some examples, during the decision phase, the feedback current is a sum of the sense current and the amplifier current, and the second current is a sum of the first current and the reference current. The reference current defines a current threshold, and is the current threshold multiplied by a third factor equal to the first factor. Thus the sense amplifier can compare the sense current with the reference current by comparing the sense current with the current threshold.

In some implementations, the sense amplifier generates an output voltage based on the result of comparing the sense current with the current threshold. When the sense current is larger than the current threshold, the sense amplifier increases the output voltage to a higher voltage level until clamped. When the sense current is smaller than the current threshold, the sense amplifier decreases the output voltage to a lower voltage level until clamped.

In some implementations, the sense amplifier includes an inverter. The inverter receives the output voltage and generates the output based on the output voltage. The inverter can generate a voltage based on a comparison between the output voltage and an inverter threshold voltage. In some examples, the inverter is configured to change the output voltage with the same polarity. In other examples, the inverter is configured to change the output voltage with an opposite polarity. For example, if the output voltage is larger than the inverter threshold voltage, the inverter can generate a voltage close to 0 V, corresponding to a logic zero. If the output voltage is smaller than the inverter threshold voltage, the inverter can generate a voltage close to a high voltage, corresponding to a logic one.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A circuitry comprising:
   a first circuit operable to generate a first current corresponding to an amplifier current flowing through an amplifier, the amplifier current being based on a sense current at a sense node;
   a second circuit operable to generate a second current corresponding to a feedback current generated by a feedback circuit coupled to the amplifier, the feedback current being associated with the sense current and the amplifier current; and
   a reference circuit coupled between the first circuit and the second circuit and operable to generate a reference current, the reference current being associated with the first current and the second current,
   wherein the first circuit is operable to generate an output voltage based on a result of comparing the sense current with a current threshold associated with the reference current.

2. The circuitry of claim 1, further comprising:
   an inverter operable to receive the output voltage from the first circuit and provide an output based on the output voltage.

3. The circuitry of claim 2, wherein the sense node is coupled to a memory cell, the sense current represents a state of the memory cell, and the output of the inverter corresponds to a logic zero or a logic one.

4. The circuitry of claim 1, wherein the feedback current is a sum of the amplifier current and the sense current, and the second current is a sum of the first current and the reference current.

5. The circuitry of claim 4, wherein the feedback circuit is operable to, together with the amplifier, compensate variations of the sense current.

6. The circuitry of claim 1, wherein the first circuit is operable to:
   increase the output voltage to a higher voltage level until clamped when the sense current is larger than the current threshold, and
   decrease the output voltage to a lower voltage level until clamped when the sense current is smaller than the current threshold.

7. The circuitry of claim 6, wherein the higher voltage level is $V_{DD}-2V_{ds\_sat}$, and the lower voltage level is $V_{ds\_sat}$, where $V_{DD}$ is a supply voltage provided to one or more transistors, and $V_{ds\_sat}$ is a saturated voltage between a source and a drain of the one or more transistors.

8. The circuitry of claim 1, wherein the first current is equal to the amplifier current multiplied by a first factor, the second current is equal to the feedback current multiplied by a second factor, and the reference current is equal to the current threshold multiplied by a third factor, and
   wherein the first factor, the second factor, and the third factor are equal.

9. The circuitry of claim 1, wherein the amplifier is operable to provide a voltage based on the amplifier current, and
   wherein the feedback circuit is operable to receive the voltage from the amplifier and generate the feedback current based on the voltage.

10. The circuitry of claim 9, wherein
    the second circuit comprises:
       a first p-type transistor configured to be in a first current mirror arrangement with a second p-type transistor in the feedback circuit,
       wherein the first p-type transistor includes a source for receiving a first supply voltage, a gate coupled to a gate of the feedback circuit for receiving the voltage from the amplifier, and a drain coupled to the reference circuit and the first circuit, and
       wherein the second p-type transistor includes a source for receiving a second supply voltage, a gate for receiving the voltage from the amplifier, and a drain coupled to the sense node;
    the first circuit comprises:
       a third p-type transistor configured to be in a second current mirror arrangement with a fourth p-type transistor in the amplifier, the third p-type transistor including a source coupled to the drain of the first p-type transistor and the reference circuit, a gate, and a drain for outputting the output voltage; and
       a first n-type transistor configured to be in a third mirror arrangement with a second n-type transistor in the amplifier, the first n-type transistor including a drain coupled to the drain of the third p-type transistor, a gate coupled to the gate of the second n-type transistor for receiving a first bias voltage, and a source coupled to the ground; and the reference circuit comprises:
- a fifth p-type transistor including a source coupled between the drain of the first p-type transistor and the source of the third p-type transistor, a gate, and a drain; and
- a third n-type transistor including a drain coupled to the drain of the fifth p-type transistor, a gate for receiving a second bias voltage, and a source coupled to the ground.

11. The circuitry of claim 10, wherein one of the first and second bias voltages is different from one of the first and second supply voltages and has no dependence with the one of the first and second supply voltages.

12. A sense amplifier comprising:
an amplifier;
a feedback circuit; and
an output stage comprising:
- a first circuit operable to generate a first current corresponding to an amplifier current flowing through the amplifier, the amplifier current being based on a sense current at a sense node;
- a second circuit operable to generate a second current corresponding to a feedback current generated by the feedback circuit coupled to the amplifier, the feedback current being associated with the sense current and the amplifier current; and
- a reference circuit coupled between the first circuit and the second circuit and operable to generate a reference current, the reference current being associated with the first current and the second current,
- wherein the first circuit is operable to generate an output voltage based on a result of comparing the sense current with a current threshold associated with the reference current.

13. The sense amplifier of claim 12, wherein the output voltage further comprises:
- an inverter operable to receive the output voltage from the first circuit and provide an output based on the output voltage.

14. The sense amplifier of claim 13, wherein the sense node is coupled to a memory cell, the sense current represents a state of the memory cell, and the output of the inverter corresponds to a logic zero or a logic one.

15. The sense amplifier of claim 12, wherein the amplifier is configured to receive a control signal for enabling and disabling the sense amplifier and provide a voltage based on the amplifier current,
wherein the feedback circuit is configured to receive the voltage from the amplifier and generate the feedback current based on the voltage, and
wherein the reference circuit is configured to receive a reference control signal for enabling and disabling the reference circuit.

16. The sense amplifier of claim 15, wherein the control signal includes an off phase, a sense phase, and a decision phase starting at the end of the sense phase,
wherein the control signal is configured to disable the sense amplifier during the off phase and enable the sense amplifier during the sense phase and the decision phase, and
wherein the reference control signal is configured to disable the reference circuit during the off phase and the sense phase and enable the reference circuit during the decision phase.

17. The sense amplifier of claim 16, wherein the feedback circuit is configured to, together with the amplifier, compensate variations of the sense current during the sense phase, and
wherein, during the decision phase, the output stage is configured to:
- increase the output voltage to a higher voltage level until clamped when the sense current is larger than a current threshold defined by the reference current, and
- decrease the output voltage to a lower voltage level until clamped when the sense current is smaller than the current threshold.

18. A method comprising:
generating, by a first circuit, a first current corresponding to an amplifier current flowing through an amplifier, the amplifier current being based on a sense current at a sense node;
generating, by a second circuit, a second current corresponding to a feedback current generated by a feedback circuit coupled to the amplifier, the feedback current being associated with the sense current and the amplifier current;
generating, by a reference circuit coupled between the first circuit and the second circuit, a reference current, the reference current being associated with the first current and the second current; and
providing an output based on a result of comparing the sense current with a current threshold associated with the reference current.

19. The method of claim 18, wherein the sense node is coupled to a memory cell, and the output corresponds to a state of the memory cell.

20. The method of claim 19, wherein providing an output comprising:
generating, by the first circuit, an output voltage based on the result of comparing the sense current with the current threshold; and
providing, by an inverter, the output based on a comparison between the output voltage and a threshold voltage.

* * * * *

UNITED STATES PATENT AND TRADEMARK OFFICE
CERTIFICATE OF CORRECTION

Page 1 of 1

PATENT NO. : 9,621,112 B2
APPLICATION NO. : 15/262805
DATED : April 11, 2017
INVENTOR(S) : Bedarida et al.

It is certified that error appears in the above-identified patent and that said Letters Patent is hereby corrected as shown below:

In the Specification

Column 5, Line 56, replace "Ikea" with --$I_{feed}$--;

Column 6, Line 16, replace "$I_{Nb2}=q\times I_{Nb1}$." with --$I_{Nb2}=q\times I_{Nb1}$.--;

Column 6, Line 35, replace "NO" with --N0--;

Column 6, Line 38, replace "NO," with --N0,--;

Column 6, Line 39, replace "NO" with --N0--;

Column 7, Line 46, replace "is" with --$t_s$--; and

Column 8, Line 25, replace "$P_2$" with --P2--.

Signed and Sealed this
Twenty-third Day of May, 2017

Michelle K. Lee
*Director of the United States Patent and Trademark Office*